(12) United States Patent
Banerjee et al.

(10) Patent No.: US 9,234,942 B2
(45) Date of Patent: Jan. 12, 2016

(54) TRANSITION FAULT TESTING OF SOURCE SYNCHRONOUS INTERFACE

(71) Applicant: Apple Inc., Cupertino, CA (US)

(72) Inventors: Anuja Banerjee, San Jose, CA (US);
Samy R. Makar, Fremont, CA (US);
Vijay M. Bettada, Fremont, CA (US)

(73) Assignee: Apple Inc., Cupertino, CA (US)

( * ) Notice: Subject to any disclaimer, the term of this patent is extended or adjusted under 35 U.S.C. 154(b) by 688 days.

(21) Appl. No.: 13/624,372

(22) Filed: Sep. 21, 2012

(65) Prior Publication Data

US 2014/0088912 A1    Mar. 27, 2014

(51) Int. Cl.
*G01R 31/3185* (2006.01)

(52) U.S. Cl.
CPC .............................. *G01R 31/318594* (2013.01)

(58) Field of Classification Search
CPC .............................................. G01R 31/318552
USPC ......................................... 714/731, 726, 733
See application file for complete search history.

(56) References Cited

U.S. PATENT DOCUMENTS

| | | | |
|---|---|---|---|
| 6,452,421 B2 | 9/2002 | Saito | |
| 6,629,276 B1 * | 9/2003 | Hoffman et al. | 714/726 |
| 6,915,407 B2 | 7/2005 | Rajappa et al. | |
| 7,180,343 B2 | 2/2007 | Shin | |
| 7,793,183 B2 | 9/2010 | Yokota et al. | |
| 2010/0199006 A1 | 8/2010 | Takeuchi | |
| 2012/0079334 A1 * | 3/2012 | Tam et al. | 714/731 |

* cited by examiner

*Primary Examiner* — Fritz Alphonse
(74) *Attorney, Agent, or Firm* — Meyertons, Hood, Kivlin, Kowert & Goetzel, P.C.; Erik A. Heter

(57) ABSTRACT

A method and apparatus for conducting a transition test of a source synchronous interface is disclosed. A system includes a source synchronous transmitter and source synchronous receiver. The source synchronous transmitter includes a first scannable flop having an output coupled to a data input of a second scannable flop in the source synchronous receiver. During a transition test, the source synchronous transmitter is configured to transmit data from the first scannable flop to the second scannable flop, along with a clock signal at an operational clock speed. The first scannable flop is coupled to feedback circuitry configured to cause transitions of the transmitted data. The second scannable flop may capture the transmitted data. The captured data may be subsequently used to determine if the desired transitions were detected by the second scannable flop.

25 Claims, 5 Drawing Sheets

TRANSITION FAULT TESTING OF SOURCE SYNCHRONOUS INTERFACE

BACKGROUND

1. Technical Field

This disclosure is directed to integrated circuits, and more particularly, to testing integrated circuits having source synchronous interfaces.

2. Description of the Related Art

Testing of an integrated circuit (IC) may be conducted in various ways. One common way of conducting testing of an IC is through the use of scan testing. Circuitry to support scan testing may provide internal access to an IC. Scan circuitry may be implemented by forming chains of scannable elements. Data may be serially shifted through the scannable elements of the scan chain. This may allow for the input of test stimulus data, as well as the capture and shifting out of test result data. Using available scan circuitry, manufacturing tests may be conducted on ICs prior to their shipment to a customer in order to verify the circuitry therein.

One type of test that may be supported by scan testing is known as a transition test. In a transition test, data shifted into a scan chain may cause logical transitions of circuitry coupled thereto. Such testing may be used to determine the ability of circuitry to undergo transitions responsive to stimulus designed to cause such transitions. Both logic 0 to logic 1 and logic 1 to logic 0 transitions may be tested during a typical transition test.

Some ICs include source synchronous interfaces. Transition testing on such source synchronous interfaces may be performed by conducting separate and independent internal transition tests on each side of the interface.

SUMMARY

A method and apparatus for conducting a transition test of a source synchronous interface is disclosed. In one embodiment, a system includes a source synchronous transmitter and source synchronous receiver. The source synchronous transmitter includes a first scannable flop having an output coupled to a data input of a second scannable flop in the source synchronous receiver. During a transition test, the source synchronous transmitter is configured to transmit data from the first scannable flop to the second scannable flop, along with a clock signal at an operational clock speed. The first scannable flop is coupled to feedback circuitry configured to cause transitions of the transmitted data. The second scannable flop may capture the transmitted data, which may be subsequently used to determine if the desired transitions were detected.

In one embodiment, an output of a first scannable flop in a source synchronous transmitter is coupled to a first input of an exclusive OR (XOR) gate. The XOR gate is also coupled to receive a control signal, that when asserted, causes an output of the XOR gate to be a complement of the first input, and thus a complement to the data output of the first scannable flop. During the transition test of the source synchronous interface, the output of the XOR gate may be provided to a scan input of the first scannable flop. A scan enable signal may also be asserted on a scan enable input of the first scannable flop during the transition test of the source synchronous interface. Accordingly, assuming correct functionality, the first scannable flop will thus latch in data received through its scan input, and through the feedback circuit (including the XOR circuit), will produce logical transitions from logic 0 to logic 1 and subsequently from logic 1 to logic 0 (or vice versa). These transitions may also be conveyed across the source synchronous interface to the functional data input of the second scannable flop in the source synchronous receiver. Data from these transitions may be captured by the second scannable flop, which is also coupled to a feedback circuit similar to the first scannable flop. Thus, if the circuits are functioning correctly, the first two data values shifted from the second scannable flop during a subsequent scan operation may reflect the transitions conveyed across the source synchronous interface.

The first functional unit may also include a first clock controller and a first clock gating circuit for the source synchronous interface. The first clock gating circuit may be enabled to convey a clock signal generated by the first clock gating circuit during the transition test, as well as during normal functional operation. The clock signal may be received in the second functional unit by a second clock gater, an output of which is also coupled to a multiplexer. The other input of the multiplexer is coupled to a clock controller of the second functional unit. During the transition test, the multiplexer may be configured to select as its input the output of the second clock gater in order to convey the clock signal received from the first functional unit to a clock input of the second scannable flop. The second scannable flop also includes a scan enable input coupled to receive a corresponding scan enable signal. Since the second scannable flop is to latch data through its functional data input during the transition test, the scan enable signal provided thereto may be de-asserted as the test is conducted.

BRIEF DESCRIPTION OF THE DRAWINGS

The following detailed description makes reference to the accompanying drawings, which are now briefly described.

Figure 1:
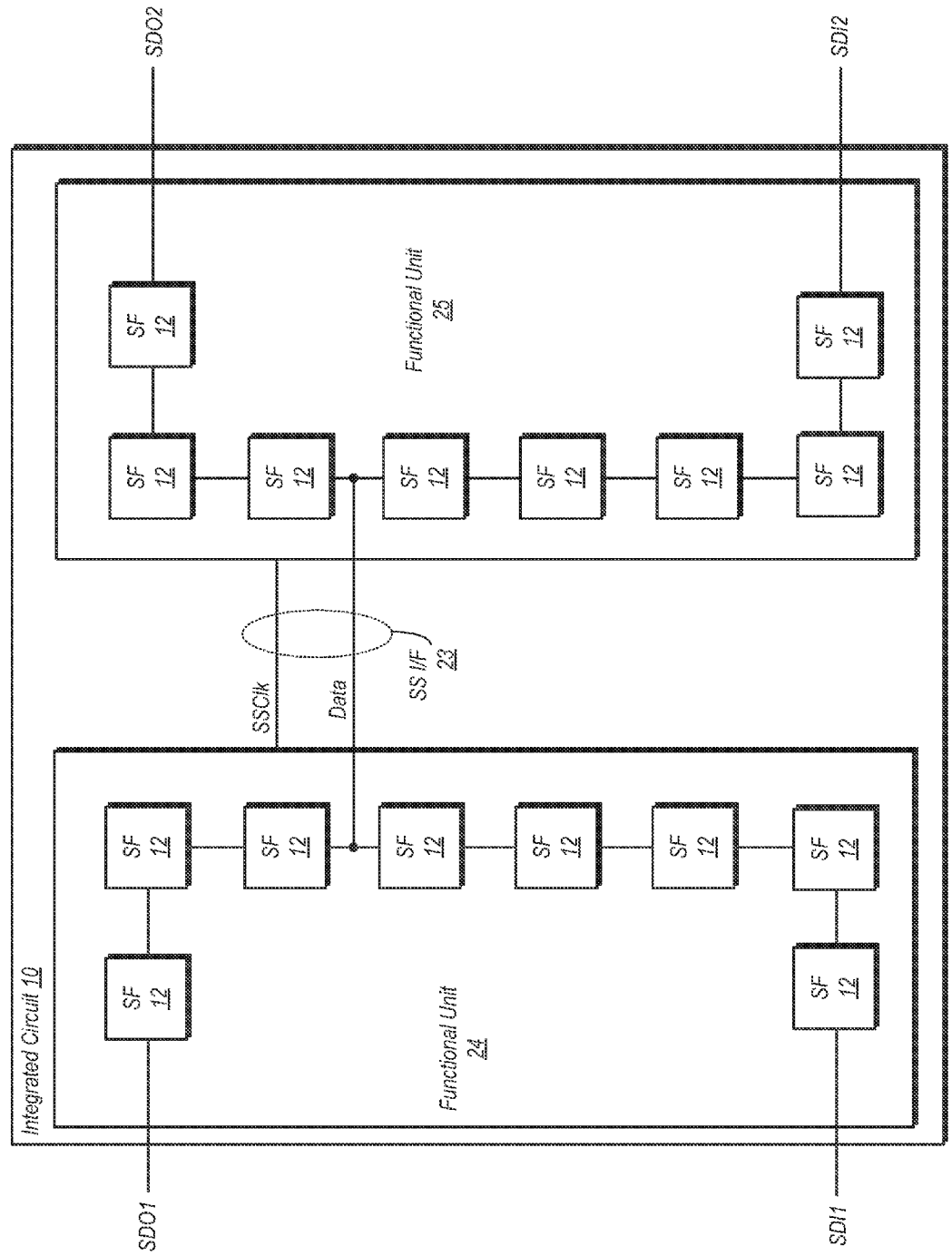
FIG. 1 is a block diagram of one embodiment of an integrated circuit having a source synchronous interface and scan chains implemented within.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) having a source synchronous interface and scan chains implemented within is shown. In the embodiment shown, IC 10 includes a first functional unit 24, a second functional unit 25, and a source synchronous interface 23 coupled therebetween. In this particular example the source synchronous interface is only a single bit wide, although embodiments having multi-bit source synchronous interfaces are possible and contemplated.

Each of functional units 24 and 25 includes a scan chain having a number of serially coupled scannable flops 12. Each of the scannable flops 12 may be coupled to other logic circuitry (not shown here for the sake of simplicity) within their respective functional units. During normal operation, the scannable flops 12 may store data received from logic circuitry coupled to their respective functional data inputs, and provide data to logic circuitry coupled to their respective outputs. During scan test operations, the scannable flops 12 may be used to serially shift test stimulus data into IC 10 through respective scan data inputs and outputs.

In this particular example, the scan chains are partitioned by functional unit. Thus, functional unit 24 acts as a first scan partition while functional unit 25 acts as a second scan partition. Test stimulus data may be applied to functional unit 24 through a first scan data input, 'SDI1'. Test result data may be received from functional unit 24 through a first scan data output, 'SDO1'. Similarly, functional unit 25 includes a respective scan data input ('SDI2') and a respective scan data output ('SDO2').

It is noted that the partitioning of scan chains as shown herein is not intended to be limiting. In other embodiments, IC 10 may include a single scan chain that spans both illustrated functional units, or multiple scan chains partitioned in various ways.

As noted above, functional unit 24 is coupled to functional unit 25 by a source synchronous interface 23. In this embodiment, source synchronous interface 23 includes a data signal path, 'Data', upon which data is conveyed from functional unit 24 to functional unit 25. Functional unit 24 is also coupled to convey a clock signal, 'SSClk', along with transmitted data. In one embodiment, the clock signal may be active when data is being transmitted, and may otherwise be inactive. The data may be transmitted from the data output of one of the scannable flops 12 in functional unit 24 to the functional data input of another scannable flop 12 in functional unit 25. The clock signal may be received at a clock input of the same scannable flop 12 at which the data is received.

It is noted that additional instances of a source synchronous interface 23 may also be present in IC 10, including instances in which data is transmitted from functional unit 25 to functional unit 24. Furthermore, while the source synchronous interface 23 discussed herein is an intra-IC interface, the discussion of source synchronous interfaces and the transition testing thereof present in this disclosure may apply to inter-IC embodiments of a source synchronous interface.

In addition to supporting scan testing within the illustrated scan partitions, IC 10 may also support transition testing of source synchronous interface 23. Moreover, IC 10 may be further configured to support transition testing of source synchronous interface 23 at an operational clock frequency, i.e. with the clock operating at a frequency equal to that which it operates during normal operations, or in a functional mode. An embodiment that supports such testing is now discussed in further detail.

Figure 2:
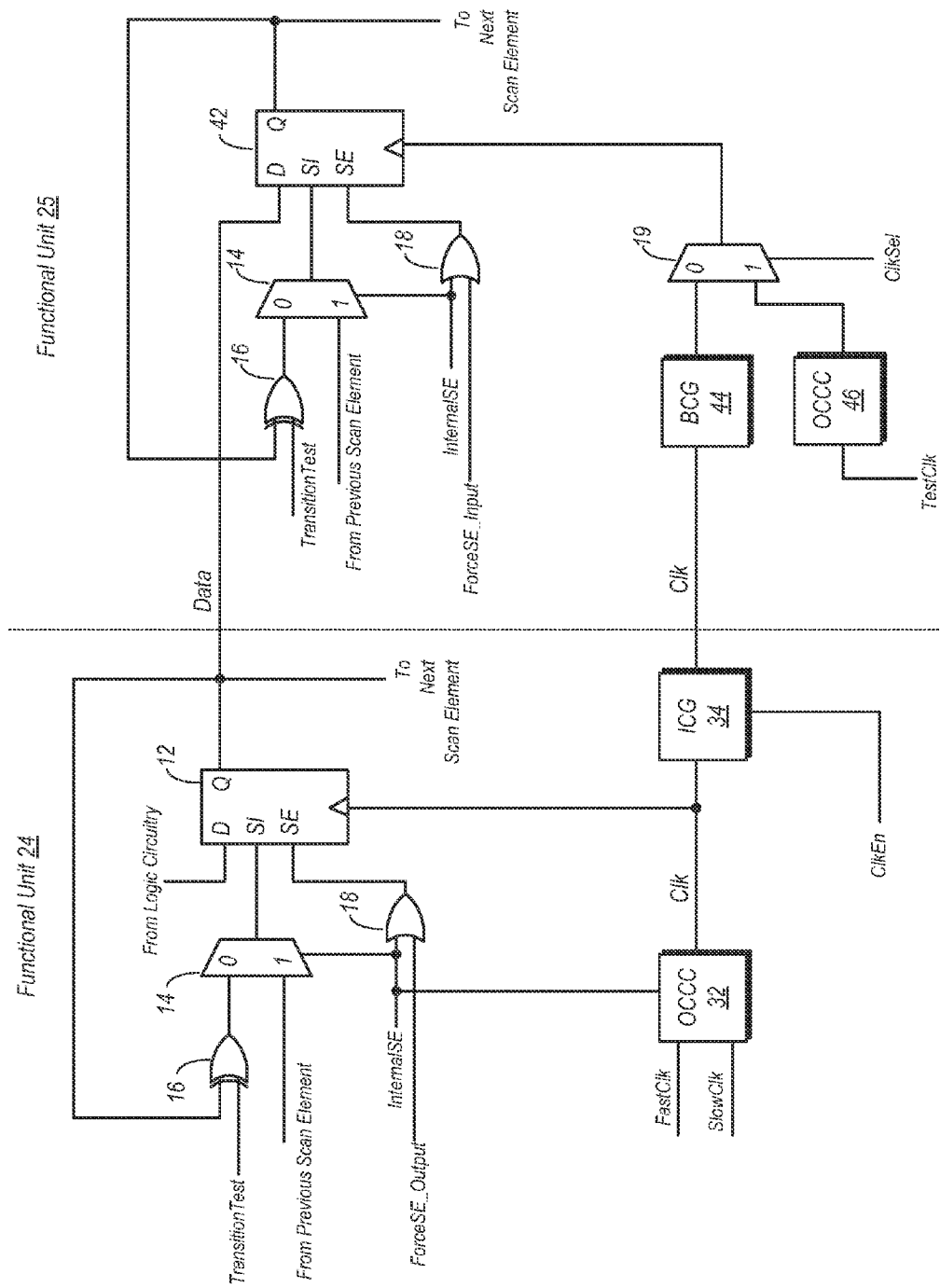
FIG. 2 is a diagram illustrating one embodiment of a source synchronous interface configured for at-speed transition testing.

Turning now to FIG. 2, a diagram illustrating one embodiment of a source synchronous interface configured for at-speed transition testing. In the embodiment shown, functional unit 24 includes a scannable flop 12 having a data output, 'Q', coupled to a functional data input, 'D', of scannable flop 42 in functional unit 25. The source synchronous interface between functional unit 24 and 25 includes illustrated data path to the functional data input of scannable flop 42, as well as the clock path ('Clk') between the two functional units.

It is noted that scannable flop 42 in this particular embodiment is equivalent to scannable flop 12, but is numbered differently here for the sake of explanation. It is further noted that the scannable flops in the illustrated embodiment are of the multiplexer-D type. However, embodiments in which the scannable flops are implemented as level sensitive scan design (LSSD) scan flops are also possible and contemplated.

In the embodiment shown, the output of scannable flop 12 is coupled to a first input of an exclusive OR (XOR) gate 16. A second input of the XOR gate 16 in functional unit 24 is configured to receive a control signal, 'TransitionTest'. When the control signal is active (i.e. a logic 1 in this embodiment), the output of XOR gate 16 is provided as a complement of its input.

Scannable flop 12 has two different data inputs. A first data input, 'D', is a functional data input coupled to logic circuitry in functional unit 24. During normal operation, and during some test operations, data may be received by scannable flop 12 through its functional data input. A second data input, 'SI', is a scan input. Data may be received through the scan input during scan shifting operations. Data may also be received through the scan input during some testing operations, including both external and internal transition tests (i.e. transition test in functional unit 24, independent of functional unit 25), as is discussed below.

Data is received by scannable flop 12 through either the functional data input 'D' depending on whether a signal is asserted on its scan enable ('SE') input. If a signal is asserted on the scan enable input, data is received into scannable flop 12 through its respective scan input. If the signal on the scan enable input is not asserted, then data is received into scannable flop 12 through its functional data input. OR gate 18 in the embodiment shown may assert a signal on the scan enable input of scannable flop 12. The output signal of OR gate 18 may be asserted responsive to the assertion of at least one of the internal scan enable ('InternalSE') or force scan enable ('ForceSE_Output') signals. The internal scan enable signal may be asserted to support scan shifting operations. The force scan enable signal may be asserted to support some test operations, including a transition test of the source synchronous interface.

Data may be received through the scan input of scannable flop 12 from the output of multiplexer 14. When the internal scan enable signal is not asserted (e.g., is a logic 0 in this embodiment), multiplexer 14 may select the output of XOR gate 16 to be transparent to the scan input of scannable flop 12. When the internal scan enable signal is asserted (e.g., logic 1 in this embodiment), the output of a previous scan element (e.g., another scannable flop 12) in a corresponding scan chain may be transparent to the scan input. This latter configuration is used to support scan shifting operations for inputting test stimulus data and outputting test result data.

Functional unit 25 includes, with respect to scannable flop 42, a similar configuration to that of scannable flop 12 in functional unit 24. More particularly, the output of scannable flop 42 is coupled to a first input of another XOR gate 16, while another multiplexer 14 includes an output coupled to its respective scan input. The output of XOR gate 16 is coupled to one of the inputs of multiplexer 14. Scannable flop 42 also includes a scan enable input coupled to an OR gate 18, which is coupled to receive an internal scan enable signal ('InternalSE) and a force scan enable signal ('ForceSE_Input). It is noted that the force scan enable signal of functional unit 25 is separate and independent of its counterpart in functional unit 24. The internal scan enable signal in this embodiment is common to both functional units 24 and 25, although embodiments are possible and contemplated in which these signals are separate and independent from one another.

As noted above, the functional data input of scannable flop 42 is coupled to the data output of scannable flop 12. Accordingly, scannable flop 12 acts as a transmitter in the source synchronous interface between the functional units, while scannable flop 42 acts as its receiver.

Functional unit 24 in the embodiment shown includes a corresponding on-chip clock controller (OCCC) 32. Among the functions provided by OCCC 32 is the selection of a fast clock signal ('FastClk') or a slow clock signal ('SlowClk'). The fast clock signal may be selected when the internal scan enable signal is de-asserted, which may occur during operation in a functional mode, as well as during transition tests, both internal to functional unit 24 as well as across the source synchronous interface. When the internal scan enable signal is asserted, the slow clock signal may be selected. Selection of the slow clock may occur during scan shifting operations. In addition to providing the clock selection function described above, OCCC 32 may also provide other clock related functions, such as inhibiting the clock signal or enabling the clock signal during transmissions of data in the functional mode of operation. Accordingly, OCCC 32 in the embodiment shown may also be coupled to receive other input signals that are not otherwise shown here.

The output of OCCC 32, 'Clk', is coupled to a clock input of scannable flop 12. Additionally, the output of OCCC 32 is coupled to an input of an interface clock gater (ICG) 34. When a clock enable ('ClkEn') signal is asserted, ICG 34 may allow the clock signal from OCCC 34 to be conveyed onto the source synchronous interface. Otherwise, when the clock enable signal is de-asserted, the clock signal output from OCCC 34 is inhibited from the source synchronous interface. During operation in the functional mode, the clock enable signal may be asserted. The clock enable signal may also be asserted during the transition testing of the source synchronous interface discussed below. During operations such as internal transition testing or scan operations, the clock enable signal may be de-asserted.

The clock signal conveyed from functional unit 24 to functional unit 25 when the clock enable signal is asserted may be received by a block clock gater (BCG) 44 in functional unit 25. BCG 44 may perform clock gating functions similar to those of ICG 34, and may thus receive a respective clock enable signal (not shown). Functional unit 25 also includes an OCCC 46, which may provide various clock control functions to its counterpart, OCCC 32, of functional unit 24.

The outputs of both BCG 44 and OCCC 46 are respectively received as first and second inputs to clock multiplexer 19. The output of clock multiplexer 19 is coupled to a clock input of scannable flop circuit 42. When the clock select signal is a logic 0, the clock signal received via BCG 44 may be passed to the clock input. The clock input may receive a clock signal from OCCC 46 when the clock select signal is a logic 1. During an normal operation, as well as during transition testing of the source synchronous interface, the clock select signal may be set to a logic 0. During scan shifting, as well as during internal transition testing (i.e. transition testing in functional unit 25 independent of functional unit 24), the clock select signal may be set to a logic 1.

Transition testing of the source synchronous interface may be conducted in the illustrated embodiment as follows. In functional unit 24, the force scan enable ('ForceSE_Output') signal may be asserted, thereby causing assertion of a signal received by the scan enable input of scannable flop 12. This in turn causes scannable flop 12 to receive data through its respective scan input. The transition test signal is also asserted to the respective input of XOR gate 16, which thus causes its output to be an inversion of data received on its other input via the data output of scannable flop 12. The internal scan enable ('InternalSE') signal is de-asserted, thereby causing OCCC 32 to provide the fast clock to both scannable flop 12 as well as across the source synchronous interface. As previously noted, the fast clock is provided at the operational clock frequency which is greater than the frequency of the scan (slow) clock. The clock enable signal is also asserted and provided to ICG 34 to allow the fast clock to propagate to functional unit 25.

In functional unit 25, both the internal scan enable ('InternalSE') and force scan enable ('ForceSE_Input') signals are de-asserted during transition testing of the source synchronous interface. This causes scannable flop 42 to receive data through its functional data input instead of through its scan data input. Since data is received through the functional data input, the state of the transition test signal to XOR gate 16 in functional unit 25 has no effect on data received by scannable flop 42. The clock select signal is set to a logic 0, and thus the clock signal originally provided via OCCC 32 in functional unit 24 may propagate through BCG 44 and clock multiplexer 19 to the clock input of scannable flop 42.

Figure 3:
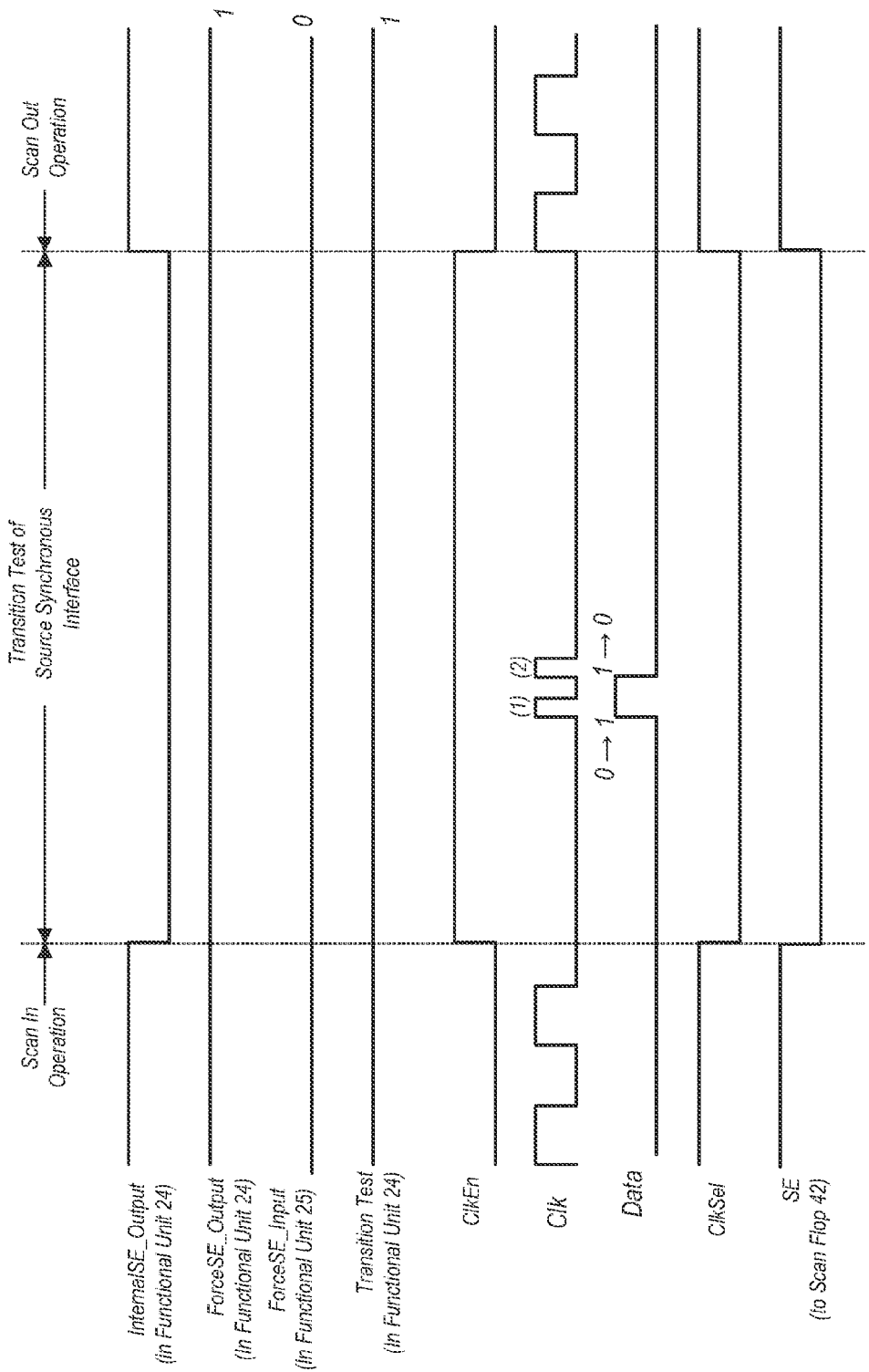
FIG. 3 is a timing diagram illustrating the signals transmitted during a transition test of a source synchronous interface.

FIG. 3 is a timing diagram further illustrating the signal states and timing for the transition test of the source synchronous interface. The transition test may be preceded by a scan in operation in which test stimulus data is shifted into the IC. Since the transition test is conducted primarily using scannable flops directly coupled to the source synchronous interface, the amount of time required for scan in operations may be reduced by providing data to only the pertinent scan elements and bypassing others (assuming the scan chain is configured to enable such operations). Some of the signal states to support scan operations are shown in FIG. 3.

As previously noted, the transition test of the source synchronous interface is supported by de-asserting the internal scan enable signal ('InternalSE') and asserting the force scan enable signal ('ForceSE_Output') in functional unit 24. The clock enable signal in functional unit 24 is also asserted to allow the clock signal to be conveyed across the source synchronous interface along with the data transmissions (which are synchronized to the clock signal). The transition test signal is asserted to its corresponding input of XOR gate 16 in functional unit 24 in order to produce the desired transitions. In functional unit 25, the clock select signal is set to a logic 0 to allow the clock signal received from functional unit 24 to propagate to the clock input of scan flop 42. Additionally, both the internal scan enable signal ('InternalSE') and force scan enable signal ('ForceSE_Input') signal in functional unit 25 are de-asserted, thereby causing a de-assertion of the scan enable signal provided to scannable flop 42.

In conducting the transition test in the illustrated example, two pulses, (1) and (2), of the clock signal are transmitted across the source synchronous interface from functional unit 24 to functional unit 25. The period of these pulses corresponds to an operational frequency so that the transitions occur, and are received, at the operational frequency of the IC. In some cases, an IC may have a number of operational frequencies, and thus the period of the pulses may correspond to a highest operating frequency. On the rising edge of pulse (1) in this particular example, a logic 0 to logic 1 transition is transmitted. Assuming correct operation, this logic 1 is received by scannable flop 42 and may be latched into that flop responsive to it also receiving the rising edge of the pulse.

In addition to the 0 to 1 transition being transmitted across the source synchronous interface, the transition is also received on the input of XOR gate 16 in functional unit 24. Since the transition test signal is a logic 1, the output of XOR gate 16 is a logical complement of it's input. Accordingly, the 0 to 1 transition on the output of scannable flop 12 in functional unit 24 thus produces, on its respective scan input, a 1 to 0 transition. On pulse (2), this transition is latched and transmitted by scannable flop 12 to scannable flop 42 in functional unit 25.

Subsequent to the second pulse, functional units 24 and 25 may be placed back into a scan mode. In functional unit 24, the first logic transition may be captured by a subsequent scan element in the scan chain, and on a subsequent scan clock pulse, the second logical transition may be shifted into the subsequent scan element. Similarly, in functional unit 25, the output of scannable flop 42 resulting from the first logical transition may be captured in a subsequent scan element in its respective scan chain, with the result of the second received transition being shifted into the subsequent scan element on the next scan clock cycle. Thereafter, the results from both functional units 24 and 25 may be shifted from their respective scan chains and analyzed. Using results from both functional units 24 and 25 may verify that scannable flop 24 properly transmitted the data during the test and scannable flop 42 properly received the transmitted data. However, it is noted that in some embodiments, data from only functional unit 25 is shifted from its respective scan chain, as test results from the receive side may be sufficient to verify whether or not the source synchronous interface functioned properly.

Figure 4:
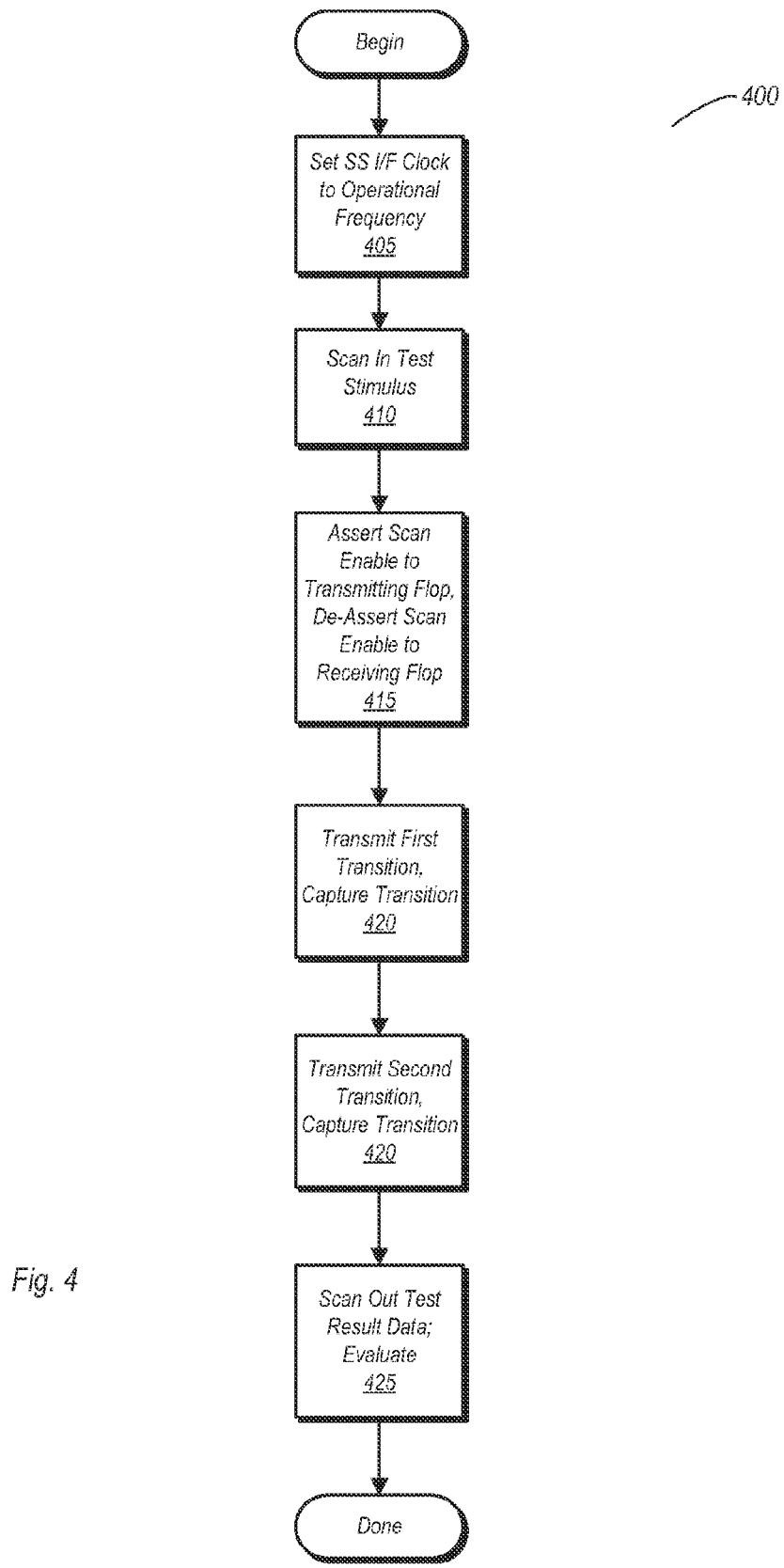
FIG. 4 is a flow diagram illustrating one embodiment of a method for conducting a transition test of a source synchronous interface.

Turning now to FIG. 4, a flow diagram illustrating one embodiment of a method for conducting a transition test of a source synchronous interface. Method 400 is described herein with respect to the apparatus embodiments discussed above. However, method 400 may be applied to other hardware embodiments not explicitly discussed herein.

Method 400 begins with the setting of the source synchronous interface clock to an operation frequency (block 405). Test stimulus data may then be shifted into both functional units 24 and 25 to place, respectively, scannable flops 12 and 42 into states in which transitions are invoked by the transmission of data during the test (block 410). At the completion of the initial scan shifting operation, a signal is asserted on the scan enable input of scannable flop 12, while a corresponding signal is de-asserted on the scan enable input of scannable flop 42 (block 415). In functional unit 24, the assertion of the scan enable signal results from assertion of the force enable signal.

After scannable flops 12 and 42 have been configured for conducting the transition test, a first pulse of the clock signal may be conveyed. Along with the first pulse of the clock signal, a first transition of the data is transmitted by scannable flop 12 and may be captured by scannable flop 42 (block 420). Subsequently, a second transition (opposite of the first) is transmitted by scannable flop 12, along with a second clock signal pulse, wherein the transition may be captured again by scannable flop 42 (block 420). Thus, the two transmitted transitions may be used to verify that both low to high and high to low transitions can be properly transmitted and received over the source synchronous interface. After completing both of the transitions, the test result data may be shifted from the IC through scan chains and evaluated (block 425).

Figure 5:
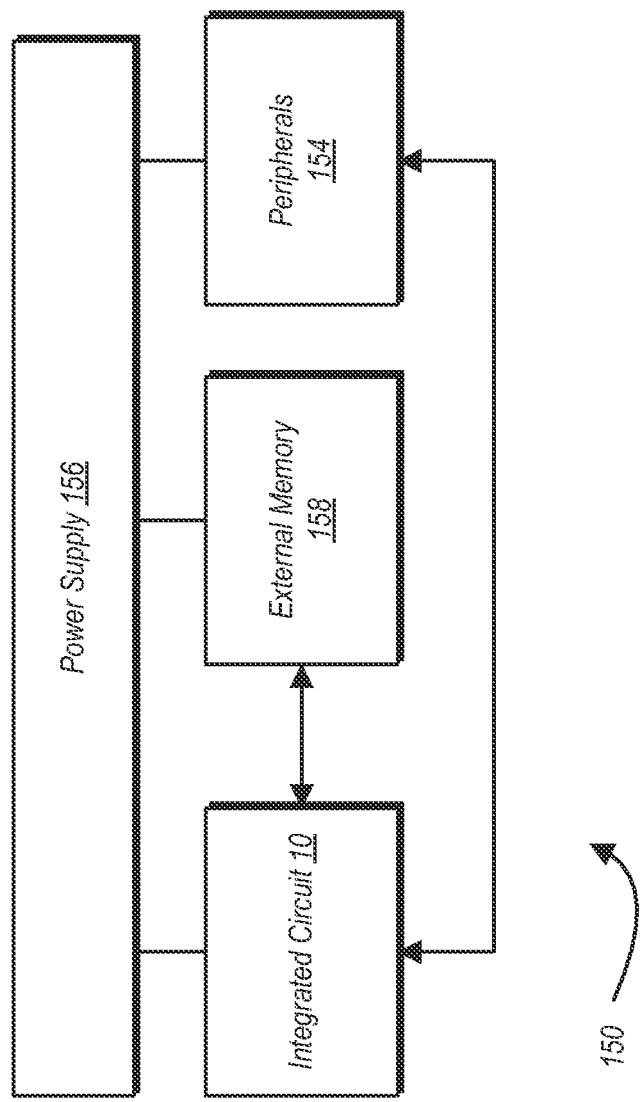
FIG. 5 is a block diagram of one embodiment of an exemplary system.

Turning next to FIG. 5, a block diagram of one embodiment of a system 150 is shown. In the illustrated embodiment, the system 150 includes at least one instance of an IC 5 (e.g., such as that shown in FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a first storage circuit configured to transmit data across a source synchronous interface, wherein the first storage circuit is configured to support scan testing;
   a clock controller, wherein the first storage circuit is configured to synchronize data transmission across the source synchronous interface to a clock signal generated by the clock controller; and
   a first feedback circuit coupled between an output of the first storage circuit and a scan data input of the first storage circuit, wherein the first feedback circuit is configured to, during a first transition test, invert data transmitted from the output of the first storage circuit and provide the inverted data through the scan input of the first storage circuit for a subsequent transmission.

2. The apparatus as recited in claim 1, wherein the clock controller is configured to provide the clock signal at an operational frequency during the transition test.

3. The apparatus as recited in claim 1, wherein the first storage circuit, the clock controller, and the feedback circuit are part of a source synchronous transmitter, and wherein the apparatus further comprises a source synchronous receiver including:
a second storage circuit having a functional data input coupled to the output of the first storage circuit, wherein the second storage circuit is configured to support scan testing, and wherein the second storage circuit is configured to capture at least one data transition received through the functional data input during the first transition test; and
a second feedback circuit coupled between an output and a scan data input of the second storage circuit, wherein the second feedback circuit is configured to, during a second transition test, invert data transmitted from the output of the output storage circuit and provide the inverted data through the scan input of the second storage circuit for a subsequent transmission.

4. The apparatus as recited in claim 3, wherein the second storage circuit includes a clock input coupled to receive, during the first transition test, the first clock signal generated by the clock controller.

5. The apparatus as recited in claim 4, wherein the source synchronous receiver includes:
a second clock controller configured to generate a second clock signal;
a multiplexer having a first input coupled to receive the first clock signal and a second input coupled to receive the second clock signal; and
a control unit configured to cause the multiplexer to provide the first clock signal to the clock input of the second storage circuit during operation in a functional mode and during the first transition test, and further configured to cause the multiplexer to provide the second clock signal to the clock input of the second storage circuit during the second transition test.

6. A method comprising:
transmitting a first data bit across a source synchronous interface of an integrated circuit, wherein the first data bit is transmitted from an output of a first scan flop in synchronization with a first pulse of a clock signal;
providing a second data bit to a scan input of the first scan flop, wherein the second data bit is generated by inverting the first data bit received from the output of the first scan flop; and
transmitting the second data bit across the source synchronous interface from the output of the first scan flop and in synchronization with a second pulse of the clock signal, wherein the first and second pulse of the clock signal are provided at an operational frequency.

7. The method as recited in claim 6, wherein the first scan flop is in a source synchronous transmitter, and wherein the method further comprises:
receiving the clock signal through a clock input of a second scan flop, wherein the second scan flop is part of a source synchronous receiver.
capturing, via a functional data input of the second scan flop, the first data bit and the second data bit.

8. The method as recited in claim 7, further comprising:
coupling the scan input of the first scan flop to a feedback path during operation during operation in a transition test mode;
coupling the scan input of the first scan flop to an output of another scan flop during operation in a scan mode; and
receiving data into the first scan flop through a functional data input of the first scan flop during operation in a functional mode.

9. The method as recited in claim 6, further comprising:
providing the clock signal at the first frequency to a clock input of the first scan flop during operation in a transition test mode, wherein the first frequency is the operational frequency;
providing the clock signal at the first frequency to the clock input of the first scan flop during operation in a functional mode; and
providing the clock signal at a second frequency during operation in a scan mode, wherein the second frequency is less than the first frequency.

10. The method as recited in claim 6, further comprising enabling a clock gating circuit to pass the clock signal from a clock control circuit across the source synchronous interface during operation in a transition test mode.

11. An integrated circuit comprising:
a first functional unit configured to conduct source synchronous data transmissions, wherein the first functional unit includes:
a first scan flop configured to transmit data from a functional data output across a source synchronous interface;
a feedback circuit configured to provide a complement of data transmitted from the functional data output to a scan data input of the first scan flop during operation in a first test mode; and
a clock controller configured to generate and transmit a clock signal at an operating frequency across the source synchronous interface during operation in the first test mode;
a second functional unit configured to receive source synchronous transmissions, wherein the second functional unit includes:
a second scan flop having a clock input coupled to receive the clock signal and a functional data input coupled to receive data from the functional data output of the first scan flop.

12. The integrated circuit as recited in claim 11, further comprising:
an enable circuit configured to assert an enable signal during operation in either one of a functional mode or the first test mode, and further configured to de-assert the enable signal during operation in a scan mode; and
a clock gating circuit coupled to receive the clock signal from the clock controller, wherein the clock gating circuit is configured to pass the clock signal to the source synchronous interface when the enable signal is asserted and further configured to inhibit the clock signal from the source synchronous interface when the enable signal is de-asserted.

13. The integrated circuit as recited in claim 11, wherein the feedback circuit includes an exclusive OR (XOR) gate having a first input coupled to the functional data output of the first scan flop and a second input coupled to receive a feedback control signal, wherein the XOR gate is configured to invert data received from the functional data output of the first scan flop when the feedback control signal is asserted.

14. The integrated circuit as recited in claim 13, wherein the first functional includes a data multiplexer having a first input coupled to an output of the XOR gate, a second input coupled to an output of another scan flop, and output coupled to the scan data input of the first scan flop, wherein the data multiplexer is configured to couple its second input to the scan data input of the first scan flop responsive to assertion of an internal scan enable signal.

15. The integrated circuit as recited in claim 14, wherein the clock controller is configured to provide the clock signal at a first frequency during a operation in a scan mode and further configured to generate the clock signal at a second frequency during operation in the first test mode and during operation in a functional mode, wherein the second frequency is greater than the first frequency, and wherein the second frequency is the operating frequency.

16. A method comprising:
transmitting, during a test, a first clock signal from a first functional unit of an integrated circuit to a second functional unit of the integrated circuit, wherein said transmitting comprises transmitting the first clock signal at an operational frequency;
transmitting a first data value from a functional data output of a first scan flop in the first functional unit to a functional data input of a second scan flop in the second functional unit, wherein each of the first and second scan flops are synchronized to the first clock signal;
generating, in a feedback path between the functional data output of the first scan flop and a scan data input of the first scan flop, a second data value by inverting the first data value;
transmitting the second data value from the functional data output of the first scan flop to the functional data input of the second scan flop; and
capturing data received from the functional output of the first scan flop by the second scan flop responsive to receiving the first and second data values.

17. The method as recited in claim 16, wherein the first functional unit is a source synchronous transmitter, and wherein the second functional unit is a source synchronous receiver.

18. The method as recited in claim 16, further comprising conducting a scan operation subsequent to capturing the data.

19. The method as recited in claim 17, further comprising:
conducting the test at a first clock frequency, wherein the first clock frequency is equal to the operational clock frequency;
conducting the scan operation at a second clock frequency, wherein the second clock frequency is less than the first clock frequency.

20. The method as recited in claim 19, further comprising conducting the scan operation using a second clock signal generated in the second functional unit, wherein the second clock signal is received by the second scan flop.

21. A system comprising:
a source synchronous transmitter including:
a first scannable flop circuit having a functional data output configured to transmit data from a functional data output across a source synchronous interface;
a first clock gating circuit configured to, when enabled, pass a first clock signal from the source synchronous transmitter to the source synchronous interface; and
a source synchronous receiver including:
a second scannable flop circuit having a functional data input coupled to the functional data output of the first scannable flop circuit and a clock input coupled to receive the first clock signal during operation in a functional mode and in a transition test mode;
wherein, during operation in the transition test mode, the first scannable flop circuit is configured to provide, to the functional data input of the second scannable flop circuit, a first data bit and a second data bit that is a complement of the first, wherein the transmitting of data by the first scannable flop circuit is synchronized to the first clock signal, wherein the first clock signal is provided at an operational frequency in the transition test mode.

22. The system as recited in claim 21, wherein the first functional unit further includes:
an exclusive OR (XOR) gate having a first input coupled to the functional data output first scannable flop; a second input coupled to receive a control signal; and
a first multiplexer having a first input coupled to an output of the XOR gate, a second input coupled to a scan element of a scan chain, and an output coupled to a scan input of the first scannable flop circuit;
wherein the XOR gate is configured to generate the second data bit as a complement of the first data bit when the control signal is asserted, and wherein the multiplexer is configured to pass the output of the XOR gate to a scan input of the first scannable flop circuit during operation in the first transition test mode.

23. The system as recited in claim 22, wherein the first scannable flop circuit includes a scan enable input coupled to receive a scan enable signal, wherein the first scannable flop circuit is configured to receive data through the scan input when the scan enable signal is asserted, and wherein the first functional unit further includes an OR gate configured to assert the scan enable signal responsive to either of an assertion of an internal scan enable signal or assertion of a transition test signal.

24. The system as recited in 22, wherein the second functional unit includes:
a second clock gating circuit coupled to receive the first clock signal from the first clock gating circuit, wherein the second clock gating circuit is configured to, when enabled, pass the first clock signal;
a clock controller configured to generate a second clock signal; and
a second multiplexer having a first input coupled to an output of the second clock gating unit, a second input coupled to an output of the clock controller, and an output coupled to a clock input of the second scannable flop circuit, wherein the second multiplexer is configured to convey the first clock signal to the clock input of the second scannable flop circuit during operation in the first transition test mode.

25. The system as recited in claim 24, wherein the first and second functional units are each configured to operate in a second transition test mode, wherein the first clock gating circuit is configured to inhibit the first clock signal from being conveyed across the source synchronous interface when operating in the second transition test mode, and wherein the second multiplexer is configured to convey the second clock signal to the clock input of the second scannable flop circuit during operation in the second transition test mode.

* * * * *